United States Patent
Wang

(10) Patent No.: US 10,229,859 B2
(45) Date of Patent: Mar. 12, 2019

(54) SEMICONDUCTOR DEVICE PACKAGE AND A METHOD OF MANUFACTURING THE SAME

(71) Applicant: Advanced Semiconductor Engineering, Inc., Kaohsiung (TW)

(72) Inventor: Wei-Jen Wang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 15/654,549

(22) Filed: Jul. 19, 2017

(65) Prior Publication Data

US 2018/0053705 A1   Feb. 22, 2018

Related U.S. Application Data

(60) Provisional application No. 62/376,337, filed on Aug. 17, 2016.

(51) Int. Cl.
*H01L 23/31* (2006.01)
*H01L 21/56* (2006.01)
(Continued)

(52) U.S. Cl.
CPC .......... *H01L 23/3114* (2013.01); *H01L 21/56* (2013.01); *H01L 24/17* (2013.01); *H01L 24/32* (2013.01); *H01L 24/83* (2013.01); *H01L 25/105* (2013.01); *H01L 25/50* (2013.01); *H01L 23/3128* (2013.01); *H01L 2224/32145* (2013.01); *H01L 2224/32225* (2013.01); *H01L 2224/73204* (2013.01); *H01L 2224/73253* (2013.01); *H01L 2224/73265* (2013.01); *H01L 2224/83191* (2013.01); *H01L 2224/92225* (2013.01); *H01L 2225/0651* (2013.01); *H01L 2225/06562* (2013.01); *H01L 2225/107* (2013.01); *H01L 2225/1023* (2013.01); *H01L 2225/1041* (2013.01); *H01L 2225/1058* (2013.01); *H01L 2225/1088* (2013.01); *H01L 2924/06* (2013.01); *H01L 2924/15311* (2013.01); *H01L 2924/15331* (2013.01); *H01L 2924/3511* (2013.01)

(58) Field of Classification Search
CPC . H01L 23/3114; H01L 23/3128; H01L 21/56; H01L 24/17; H01L 24/32; H01L 24/83; H01L 25/105
See application file for complete search history.

(56) References Cited

U.S. PATENT DOCUMENTS

2006/0244117 A1   11/2006   Karnezos et al.
2009/0008765 A1*   1/2009   Yamano .................. H01L 24/83
                                                                   257/690
(Continued)

*Primary Examiner* — Nathan W Ha
(74) *Attorney, Agent, or Firm* — Foley & Lardner LLP

(57) ABSTRACT

At least some embodiments of the present disclosure relate to a semiconductor device package. The semiconductor device package includes a first substrate, an electrical component disposed on the first substrate, a second substrate disposed over the electrical component, an adhesive layer, a spacer, and an encapsulation layer. The adhesive layer is disposed between the electrical component and the second substrate. The spacer directly contacts both the adhesive layer and the second substrate. The encapsulation layer is disposed between the first substrate and the second substrate.

20 Claims, 8 Drawing Sheets

(51) Int. Cl.
*H01L 23/00* (2006.01)
*H01L 25/10* (2006.01)
*H01L 25/00* (2006.01)

(56) References Cited

U.S. PATENT DOCUMENTS

| | | | | |
|---|---|---|---|---|
| 2012/0231583 A1* | 9/2012 | Onishi | ............... | C08G 59/3209 |
| | | | | 438/114 |
| 2013/0341784 A1* | 12/2013 | Lin | .................... | H01L 23/3121 |
| | | | | 257/737 |
| 2015/0028477 A1* | 1/2015 | Jung | ...................... | H01L 24/13 |
| | | | | 257/738 |
| 2015/0348928 A1* | 12/2015 | Co | ......................... | H01L 24/17 |
| | | | | 257/712 |
| 2016/0013144 A1* | 1/2016 | Chen | .................. | H01L 23/3128 |
| | | | | 257/774 |
| 2016/0172292 A1* | 6/2016 | Hsu | ........................ | H01L 23/13 |
| | | | | 257/698 |
| 2016/0329262 A1* | 11/2016 | Hsiao | ...................... | H01L 23/50 |
| 2016/0329308 A1* | 11/2016 | Co | ......................... | H01L 24/17 |
| 2018/0076159 A1* | 3/2018 | Chen | .................... | H01L 25/071 |

\* cited by examiner

SEMICONDUCTOR DEVICE PACKAGE AND A METHOD OF MANUFACTURING THE SAME

CROSS-REFERENCE TO RELATED APPLICATIONS

This application claims the benefit of and priority to U.S. Provisional Application No. 62/376,337, filed Aug. 17, 2016, the content of which is incorporated herein by reference in its entirety.

BACKGROUND

1. Technical Field

The present disclosure relates to a semiconductor device package and to a semiconductor device package including an adhesive layer disposed between an electrical component and an upper substrate/interposer.

2. Description of the Related Art

In a semiconductor device package formed by a package on package (PoP) technique, an upper package can be mounted to a lower package. The upper package can include a die (e.g. a memory die) attached to substrate/interposer of the upper package. The lower package can include an upper substrate/interposer, a lower substrate/interposer, and another die (e.g. a logic die) attached to the lower substrate/interposer of the lower package. An encapsulant, which includes resin and fillers, can be formed between the upper substrate/interposer of the lower package and the lower substrate/interposer of the lower package to encapsulate the logic die for protection. However, miniaturization of the semiconductor device package may reduce a space between the logic die and the upper substrate/interposer of the lower package, and it may be challenging to form the encapsulant in the space. For example, when the space between the logic die and the upper substrate/interposer of the lower package is smaller than an average filler size of fillers of the encapsulant, the encapsulant may not completely encapsulate the logic die which may result in voids that can cause reliability issues.

SUMMARY

In some embodiments, according to an aspect of the present disclosure, a semiconductor device package includes a first substrate, an electrical component disposed on the first substrate, a second substrate disposed over the electrical component, an adhesive layer, a spacer, and an encapsulation layer. The adhesive layer is disposed between the electrical component and the second substrate. The spacer directly contacts both the adhesive layer and the second substrate. The encapsulation layer is disposed between the first substrate and the second substrate.

In some embodiments, according to another aspect of the present disclosure, a semiconductor device package includes a first substrate, an electrical component disposed on the first substrate, a second substrate disposed over the electrical component, an adhesive layer, and an encapsulation layer. The adhesive layer is disposed between the electrical component and the second substrate and is in direct contact with both the electrical component and the second substrate. The encapsulation layer is disposed between the first substrate and the second substrate.

In some embodiments, according to still another aspect of the present disclosure, a method for manufacturing a semiconductor device package includes: providing a first substrate, disposing an electrical component on the first substrate, disposing an adhesive layer on the electrical component, providing a second substrate, mounting the second substrate to the first substrate, and forming an encapsulation layer between the first substrate and the second substrate.

DETAILED DESCRIPTION

Figure 1:
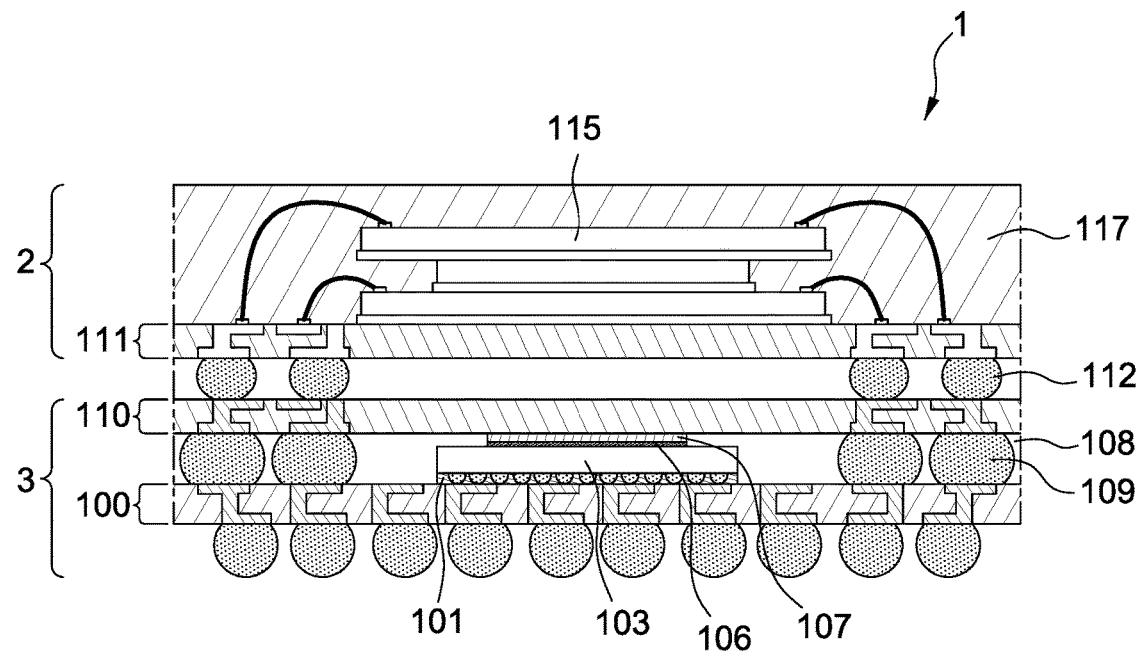
FIG. 1 illustrates a cross-sectional view of some embodiments of a semiconductor device package according to a first aspect of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

FIG. 1 is a cross-sectional view of some embodiments of a semiconductor device package 1 in accordance with a first aspect of the present disclosure. The semiconductor device package 1 includes an upper package 2 and a lower package 3. The upper package 2 is disposed over the lower package 3 through connection elements 112. The upper package 2 includes a lower substrate 111. An electrical component 115 is attached on the lower substrate 111. An encapsulation layer 117 encapsulates the electrical component 115. The lower package 3 includes an upper substrate 110 and a lower substrate 100. An interconnection element 109 contacts (and, for example, electrically connects) a top surface of the lower substrate 100 and a bottom surface of the upper substrate 110. An electrical component 103 is attached on the lower substrate 100 along with an underfill layer 101. In some embodiments, the electrical component 115 may include a memory die. The electrical component 103 may include a logic die. An adhesive layer 106 is disposed on the top surface of the electrical component 103. A spacer 107 directly contacts both the adhesive layer 106 and the bottom surface of the upper substrate 110. An encapsulation layer 108 encapsulates the electrical component 103, the adhesive layer 106, the spacer 107, and the interconnection element 109. In some embodiments, a material of the encapsulation layer 108 may be substantially the same as that of the encapsulation layer 117. The material of the encapsulation layer 108 may be different from that of the encapsulation layer 117. In some embodiments, the adhesive layer 106 includes a thermosetting resin. The adhesive layer 106 may include a thermoplastic resin. The spacer 107 includes an epoxy resin or other insulating materials used additionally or alternatively. The spacer 107 may include a solder mask layer.

Figure 2:
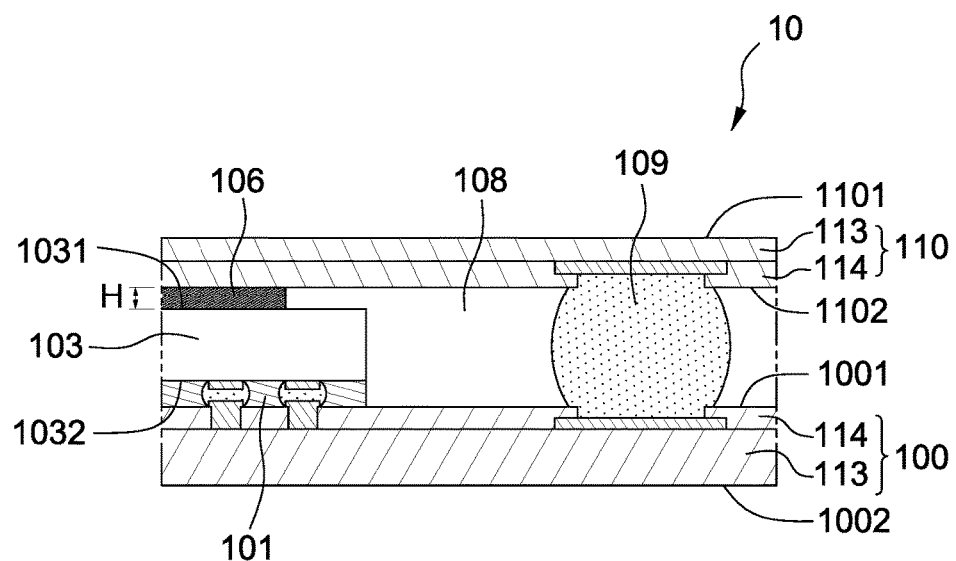
FIG. 2 illustrates a cross-sectional view of some embodiments of a semiconductor device package according to a second aspect of the present disclosure.

FIG. 2 is a cross-sectional view of some embodiments of a semiconductor device package 10 in accordance with a second aspect of the present disclosure. The semiconductor device package 10 includes a lower substrate 100, an electrical component 103, an adhesive layer 106, an encapsulation layer 108, an interconnection element 109, and an upper substrate 110. The lower substrate 100 has a top surface 1001 and a bottom surface 1002. The upper substrate 110 has a top surface 1101 and a bottom surface 1102. In some embodiments, an additional electrical component (which is not shown in FIG. 2) may be disposed on the top surface 1101 of the upper substrate 110 and encapsulated by an additional encapsulation layer (which is not shown in FIG. 2). The additional electrical component may include a memory die. The interconnection element 109 contacts (and, for example, electrically connects) the top surface 1001 of the lower substrate 100 and the bottom surface 1102 of the upper substrate 110. The encapsulation layer 108 encapsulates the electrical component 103, the adhesive layer 106, and the interconnection element 109.

In some embodiments, the lower substrate 100 or the upper substrate 110 may be or may include a package substrate or an interposer. In some embodiments, the structures of the lower substrate 100 and the upper substrate 110 may be the same as each other (e.g. may include substantially the same components and/or may have substantially the same shape). The structures of the lower substrate 100 and the upper substrate 110 may be different from each other. The lower substrate 100 and/or the upper substrate 110 may include an interconnection structure, such as a redistribution layer (RDL) or a grounding element or a pad. In some embodiments, the grounding element includes a via that is exposed from a lateral surface of the lower substrate 100 or the upper substrate 110. In some embodiments, the grounding element includes a metal layer exposed from the lateral surface of the lower substrate 100 or the upper substrate 110. In some embodiments, the grounding element includes a metal trace exposed from the lateral surface of the lower substrate 100 or the upper substrate 110.

The lower substrate 100 includes an upper dielectric layer 114 and a lower dielectric layer 113. For example, a material of the upper dielectric layer 114 may include a solder mask or other suitable dielectric material. A material of the lower dielectric layer 113 may be different from that of the upper dielectric layer 114. The material of the lower dielectric layer 113 may be substantially the same as that of the upper dielectric layer 114. For example, the lower dielectric layer 113 may include a core layer which includes a bismaleimide-triazine (BT) resin or a glass-reinforced epoxy composite (e.g., a composite having an FR-4 grade). In some embodiments, the upper substrate 110 has a structure that mirrors that of the lower substrate 100 and includes an upper dielectric layer 113 (which can be similar to the lower dielectric layer 113 of the lower substrate 100) and a lower dielectric layer 114 (which can be similar to the upper dielectric layer 114 of the lower substrate 100).

The electrical component 103 has a top surface 1031 and a bottom surface 1032. The electrical component 103 is disposed on the top surface 1001 of the lower substrate 100 along with an underfill layer 101. The electrical component 103 includes pads on the bottom surface 1032. The pads on the bottom surface 1032 of the electrical component 103 are electrically connected to the pads on the top surface 1001 of the lower substrate 100 through interconnection elements (not denoted in FIG. 2), such as a deposit of solder material or solder balls. The underfill layer 101 is disposed between the electrical component 103 and the lower substrate 100 and surrounds the pads of the electrical component 103, the pads of the lower substrate 100, and the interconnection elements. The electrical component 103 may include a logic die. The electrical component 103 may include an application-specific integrated circuit (ASIC), a controller, a processor or other electronic component or semiconductor device. The top surface 1031 of the electrical component 103 is separated from the bottom surface 1102 of the upper substrate 110 by a distance referred to herein as a height (H). The height (H) is in a range from approximately 10 micrometers (μm) to approximately 30 μm.

The adhesive layer 106 is disposed on the top surface 1031 of the electrical component 103. The adhesive layer 106 partially covers the electrical component 103. In some embodiments, the adhesive layer 106 may cover substantially the entire top surface 1031 of the electrical component 103 (e.g. may cover at least about 90% of the top surface 1031 of the electrical component 103). The adhesive layer 106 includes a thermosetting resin. The adhesive layer 106 has a thickness in a range from approximately 10 μm to approximately 30 μm. The adhesive layer 106 can help to maintain a fixed or a minimum space between the electrical component 103 and the upper substrate 110 that provides for a set separation of components. The height (H) is substantially equal to the thickness of the adhesive layer 106. A thermosetting material that can be used in the adhesive layer 106 can be transformed from a gel-type material into a film-type material through one curing operation. This curing operation can, in some embodiments, be more readily implemented than can a curing operation of a thermoplastic material, which can be transformed from a first film-type material into a gel-type material into a second film-type material through two or more curing operations, and which may deform during the two or more curing operations. Furthermore, the thermosetting material is less likely to deform during the curing stage. The adhesive layer 106 implementing the thermosetting material may provide for a substantially fixed separation between the electrical component 103 and the upper substrate 110 after the curing operation described above (e.g. after a single curing operation).

The encapsulation layer 108 includes fillers of at least one filler type having a diameter (D). The size (e.g., diameter (D)) of the fillers may range from approximately 5 μm to approximately 20 μm. In some embodiments, the average size of the fillers may be in a range from approximately 8 μm to approximately 12 μm (e.g., may be approximately 8 μm, approximately 9 μm, approximately 10 μm, approximately 11 μm, or approximately 12 μm). The height (H) can be greater than or equal to about three times the average diameter of the fillers. In such a configuration, the encapsulation layer 108 can fill substantially the entire space between the top surface 1031 of the electrical component 103 and the bottom surface 1102 of the upper substrate 110 (e.g. completely fills the space) and can help to prevent voids being generated in the encapsulation layer 108.

In one or more embodiments, the interconnection element 109 may include a solder ball which contains tin (Sn) in an amount ranging from about 95 percent by weight (wt %) to about 99.8 wt %. The diameter of the interconnection element 109 is in a range from approximately 0.10 millimeters (mm) to approximately 0.16 mm. In some embodiments, the interconnection element 109 may include a conductive post or a coated metal ball. If miniaturization of the semiconductor device package 10 is desired, the size of the interconnection element 109 can be readily made smaller since the interconnection element 109 is made of almost pure Sn.

Figure 3:
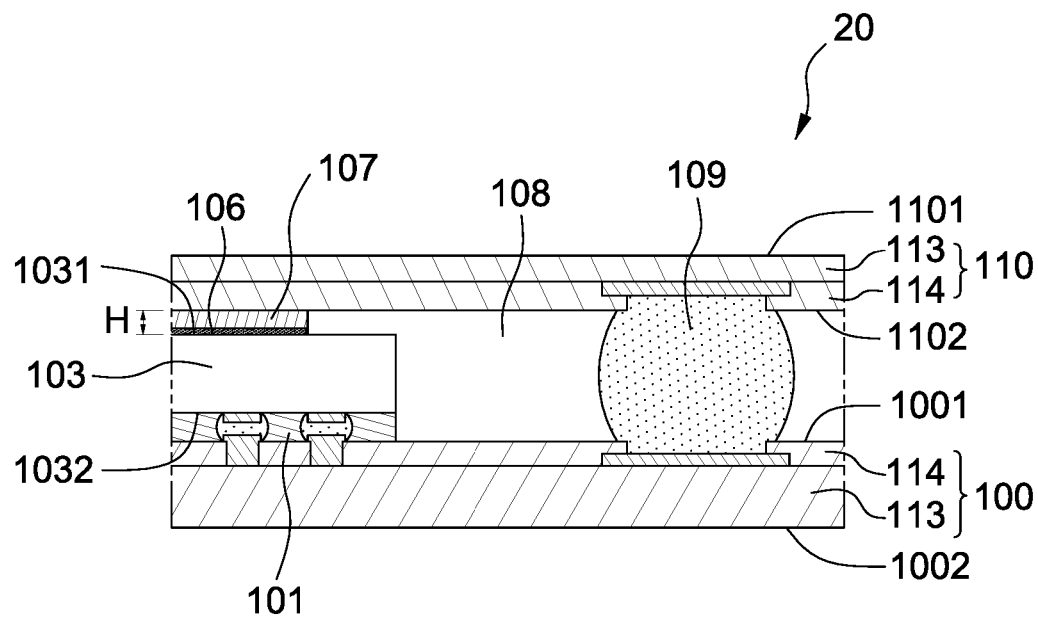
FIG. 3 illustrates a cross-sectional view of some embodiments of a semiconductor device package according to a third aspect of the present disclosure.

FIG. 3 is a cross-sectional view of some embodiments of a semiconductor device package 20 in accordance with a third aspect of the present disclosure. The structure depicted in FIG. 3 is similar to the structure depicted in FIG. 2, except that a spacer 107 is included in the structure depicted in FIG. 3. In some embodiments, a material other than the above-described thermosetting material can be used in the adhesive layer 106. In some embodiments, the spacer 107 is disposed on the bottom surface 1102 of the upper substrate 110. The spacer 107 directly contacts a top surface of the adhesive layer 106, and/or is partially embedded in the top surface of the adhesive layer 106. The position and/or the thickness of the spacer 107 would be set as appropriate. In the depicted embodiments, the thickness of the spacer 107 is larger than the thickness of the adhesive layer 106. In some embodiments, the thickness of the spacer 107 may be in a range from approximately 5 μm to approximately 25 μm. In some embodiments, the adhesive layer 106 may include a thermosetting resin. In some embodiments, the adhesive layer 106 may include a thermoplastic resin. The thickness of the adhesive layer 106 may be in a range from approximately 5 μm to approximately 10 μm. In some embodiments, the adhesive layer 106 includes a thermoplastic resin and its thickness may be in a range from approximately 5 μm to approximately 10 μm, which can help to mitigate deformation of the thermoplastic resin. The height (H) is substantially equal to the sum of the thickness of the spacer 107 plus the thickness of the adhesive layer 106. In some embodiments, the height (H) is in a range from approximately 10 μm to approximately 30 μm.

The arrangement of the spacer 107 and the adhesive layer 106 disposed between the upper substrate 110 and the electrical component 103 can help to maintain a separation between components of the semiconductor package device 20 (e.g. between the lower surface 1102 of the upper substrate 110 and the upper surface 1031 of the electrical component 103), which can provide for a product that closely matches design specifications. The encapsulation layer 108 can fill substantially the entire space between the top surface 1031 of the electrical component 103 and the bottom surface 1102 of the upper substrate 110 (e.g. completely fills the space) substantially without voids, or with few voids. In some embodiments, the arrangement of the spacer 107 and the adhesive layer 106 may partially cover the first electrical component 103. In some embodiments, the arrangement of the spacer 107 and the adhesive layer 106 may cover substantially the entire top surface 1031 of the first electrical component 103.

In some embodiments, a material of the spacer 107 includes an epoxy resin, an adhesive film with fillers, or other insulating materials used additionally or alternatively. The material of the spacer 107 may be substantially the same as that of the encapsulation layer 108. The spacer 107 may include a solder mask layer. The material of the spacer 107 is harder than the adhesive layer 106. Since the material of the spacer 107 is harder than the adhesive layer 106 and the spacer 107 directly contacts the bottom surface 1102 of the upper substrate 110, the spacer 107 may bear and/or transmit stress incurred from a mounting operation and/or a gang bonding operation. The semiconductor package device 20 including the spacer 107 can more uniformly distribute the stress generated by the mounting operation and gang bonding operation than can some other semiconductor package devices that do not include a spacer 107, and the spacer 107 can help to keep the mounted upper substrate 110 substantially planar so as to avoid tilting and/or warpage that may be induced from the mounting operation and gang bonding operation.

Figure 4:
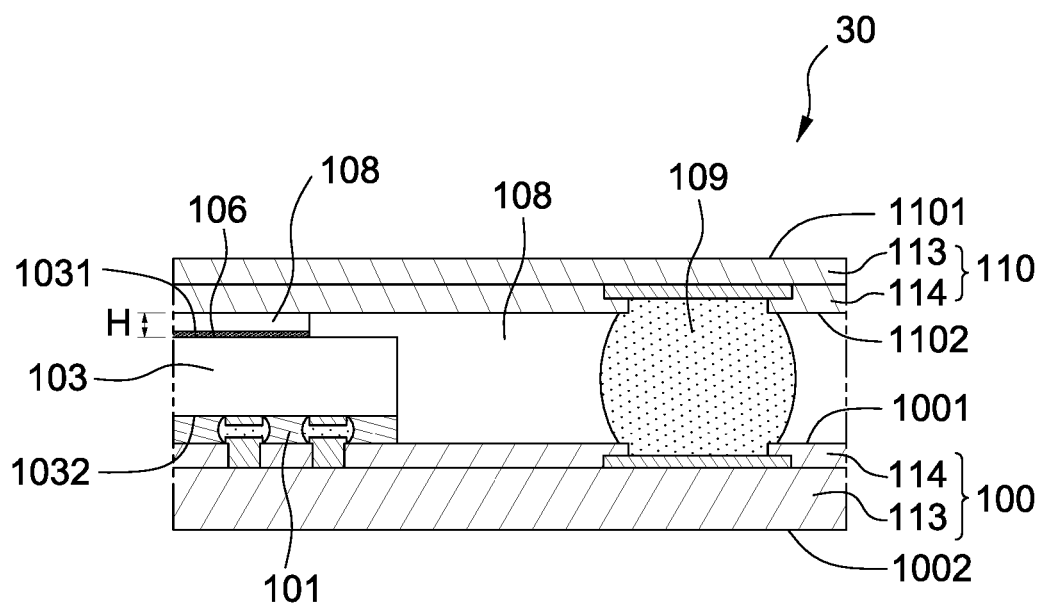
FIG. 4 illustrates a cross-sectional view of some embodiments of a semiconductor device package according to a fourth aspect of the present disclosure.

FIG. 4 is a cross-sectional view of some embodiments of a semiconductor device package 30 in accordance with a fourth aspect of the present disclosure. The structure depicted in FIG. 4 is similar to the structure depicted in FIG. 3, except that the spacer 107 depicted in FIG. 3 is replaced with a portion of the encapsulation layer 108. In some embodiments, the portion of the encapsulation layer 108 is formed directly on the bottom surface 1102 of the upper substrate 110. The portion of the encapsulation layer 108 directly contacts the top surface of the adhesive layer 106. The position or the thickness of the portion of the encapsulation layer 108 can readily be set as appropriate based on design specifications. In some embodiments, the thickness of the portion of the encapsulation layer 108 may be in a range from approximately 5 μm to approximately 25 μm.

In some embodiments, the adhesive layer 106 may include a thermosetting resin. In some embodiments, the adhesive layer 106 may include a thermoplastic resin. The thickness of the adhesive layer 106 may be in a range from approximately 5 μm to approximately 10 μm. In some embodiments, the adhesive layer 106 includes a thermoplastic resin and its thickness may be in a range from approximately 5 μm to approximately 10 μm so as to mitigate the deformation phenomenon of the thermoplastic resin. The height (H) is substantially equal to the sum of the thickness of the portion of the encapsulation layer 108 and the thickness of the adhesive layer 106. In some embodiments, the height (H) is in a range from approximately 10 μm to approximately 30 μm.

The arrangement of the encapsulation layer 108 and the adhesive layer 106 between the upper substrate 110 and the electrical component 103 can help to maintain a separation between components of the semiconductor package device 30 (e.g. between the lower surface 1102 of the upper substrate 110 and the upper surface 1031 of the electrical component 103), which can provide for a product that closely matches design specifications. In some embodiments, the arrangement of the encapsulation layer 108 and the adhesive layer 106 may partially cover the first electrical component 103. The arrangement of the encapsulation layer 108 and the adhesive layer 106 may cover substantially the entire top surface 1031 of the first electrical component 103. The material of the portion of the encapsulation layer 108 disposed directly on the adhesive layer 106 can be substantially the same as that of a remaining portion of the encapsulation layer 108 encapsulating the electrical component 103 and the interconnection element 109, and can have substantially the same coefficient thermal expansion (CTE) and be compatible with each other. This can help to ensure stability in the encapsulation layer 108 between the upper substrate 110 and the lower substrate 100.

FIG. 5A, FIG. 5B, FIG. 5C, FIG. 5D, FIG. 5E, FIG. 5F, and FIG. 5G illustrate a method of manufacturing a semiconductor device package according to some embodiments of the present disclosure.

Figure 5A:
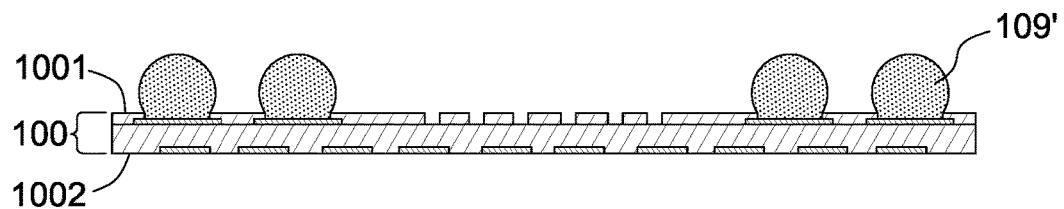
FIG. 5A, FIG. 5B, FIG. 5C, FIG. 5D, FIG. 5E, FIG. 5F, and FIG. 5G illustrate a method of manufacturing a semiconductor device package according to some embodiments of the present disclosure.

Referring to FIG. 5A, a method for manufacturing a semiconductor device package includes providing lower substrate(s) 100 (e.g. a strip type substrate). The lower substrate 100 has a top surface 1001 and a bottom surface 1002. The top surface 1001 is opposite to the bottom surface 1002. An interconnection element 109' contacts (and, for example, electrically connects to) the top surface 1001 of the lower substrate 100.

Figure 5B:
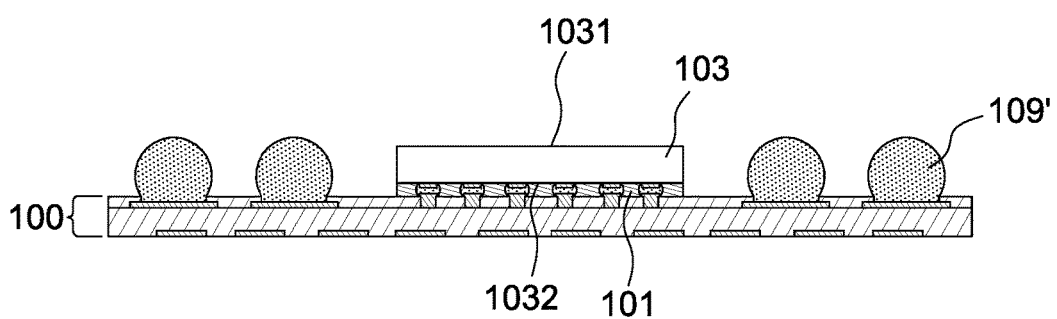

Referring to FIG. 5B, an electrical component 103 is attached on the top surface 1001 of the lower substrate 100 along with an underfill layer 101. The electrical component 103 has a top surface 1031 and a bottom surface 1032. The top surface 1031 is opposite to the bottom surface 1032. The electrical component 103 includes pads on the bottom surface 1032. The pads on the bottom surface 1032 of the electrical component 103 are electrically connected to pads on the top surface 1001 of the lower substrate 100 through interconnection elements (not denoted in FIG. 5B). The underfill layer 101 is disposed between the electrical component 103 and the lower substrate 100 to surround the pads of the electrical component 103, the pads on the top surface 1001 of the lower substrate 100, and the interconnection elements.

Figure 5C:
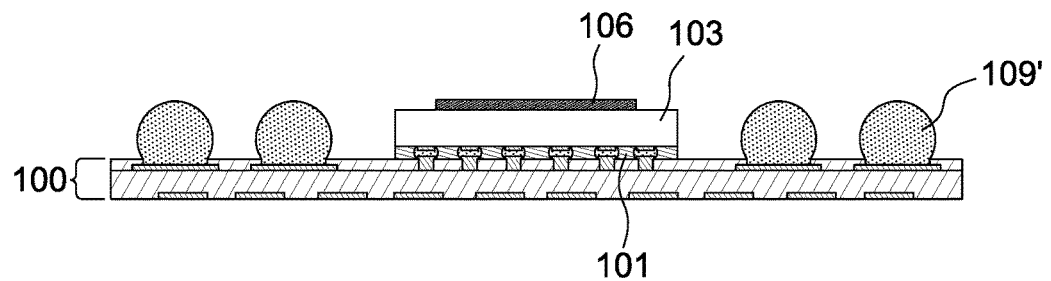

Referring to FIG. 5C, an adhesive layer 106 is formed or disposed on the top surface 1031 of the electrical component 103. The adhesive layer 106 is applied to the top surface 1031 of the electrical component 103. During one or more curing operations, the adhesive layer 106 is cured into a film-type material. In some embodiments, the temperature of the curing operation may be in a range from approximately 120 degrees Celsius to approximately 170 degrees Celsius.

In some embodiments, the adhesive layer 106 may include a thermosetting material layer that can be transformed from a gel-type material into a film-type material by a curing operation. This would help to ensure that the adhesive layer 106 would not significantly deform during the curing operation, and can help to ensure uniformity of the adhesive layer 106.

In some embodiments, the adhesive layer 106 may include a thermoplastic material layer that is transformed from a soft film-type material into a gel-type material into an elastic film-type material through curing. The thickness of the adhesive layer 106 can be made smaller than about 10 μm so as to mitigate deformation of the thermoplastic material layer.

Figure 5D:
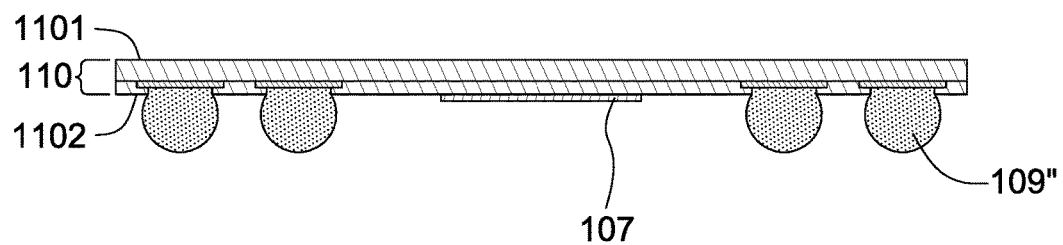

Referring to FIG. 5D, a substrate strip is divided into substrate units by singulation operations so as to providing an upper substrate 110. An interconnection element 109'" contacts (and, for example, electrically connects to) a bottom surface 1102 of the upper substrate 110. Subsequently, a spacer 107 is formed or disposed (e.g. directly formed or disposed) on the bottom surface 1102 of the upper substrate 110. By forming the spacer 107 on the upper substrate 110, a size (e.g. the thickness and/or surface area) of the spacer 107 can be readily and precisely set.

In some embodiments, the spacer 107 may be formed by one or more photolithography operations. The spacer 107 includes an epoxy resin or other insulating materials used additionally or alternatively. The spacer 107 may include a solder mask layer. A material of the spacer 107 may be the same as that of a lower dielectric layer 114 of the upper substrate 110 (see FIG. 2). In some embodiments, the material of the spacer 107 may be different from that of the lower dielectric layer 114 of the upper substrate 110.

Figure 5E:
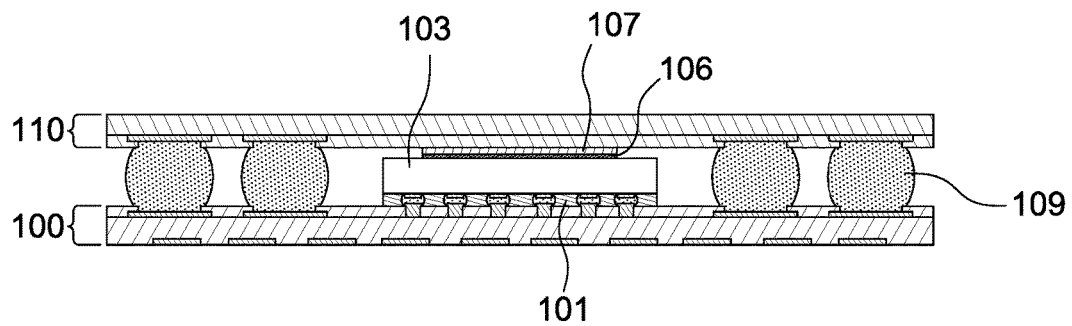

Referring to FIG. 5E, the spacer 107 of the upper substrate 110 is aligned with the adhesive layer 106 of the lower substrate 100. Subsequently, the upper substrate 110 is mounted to the lower substrate 100 through a mounting operation and a gang bonding operation. During the mounting operation and the gang bonding operation, the interconnection element 109' and the interconnection element 109'" are gang bonded and form the interconnection element 109. The arrangement of the spacer 107 and the adhesive layer 106 can help to maintain a separation between components of the semiconductor package device (e.g. between the lower surface 1102 of the upper substrate 110 and the upper surface 1031 of the electrical component 103), which can provide for a product that closely matches design specifications.

In some embodiments, during the mounting operation and gang bonding operation, the spacer 107 bonds well with the adhesive layer 106 because the material of the spacer 107 is harder than that of the adhesive layer 106. During the operations, a force is applied on the spacer 107 and through to the adhesive layer 106. Since the material of the spacer 107 is harder than the adhesive layer 106 and because the spacer 107 uniformly distributes the force, the force is uniformly applied to the adhesive layer 106 via the spacer 107. The adhesive layer 106 is pressed downwards uniformly, thus helping to prevent tilting and/or warpage issues. Accordingly, a stable, substantially planar package can be achieved.

Figure 5F:
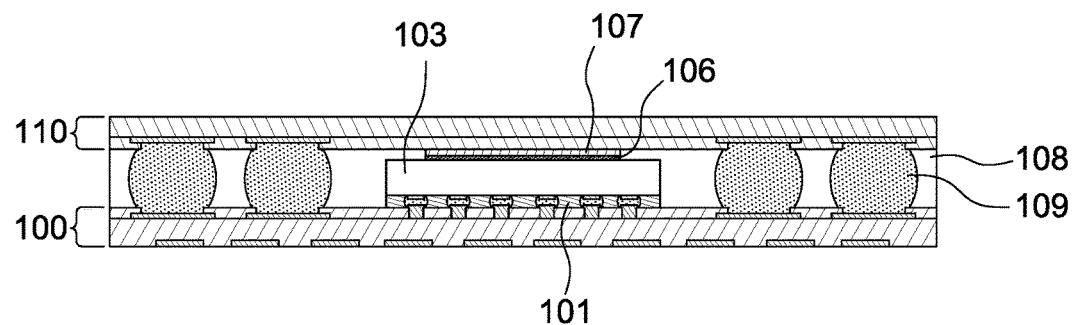

Referring to FIG. 5F, the encapsulation layer 108 is formed between the upper substrate 110 and the lower substrate 100. The encapsulation layer 108 fills substantially the entire space between the upper substrate 110 and the electrical component 103 (e.g. completely fills the space).

Figure 5G:
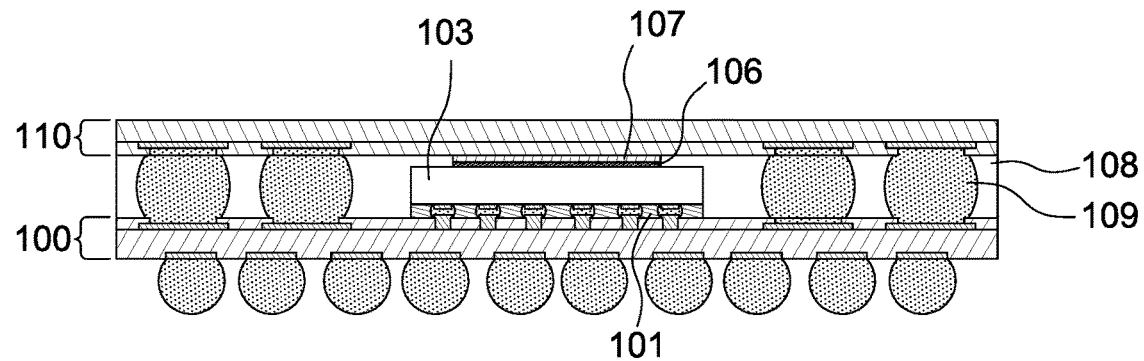

Referring to FIG. 5G, solder balls are mounted to the bottom surface 1002 of the lower substrate 100, and subsequently, singulation operations are performed, thus completing manufacture of a semiconductor package device in accordance with some embodiments described herein.

Figure 6:
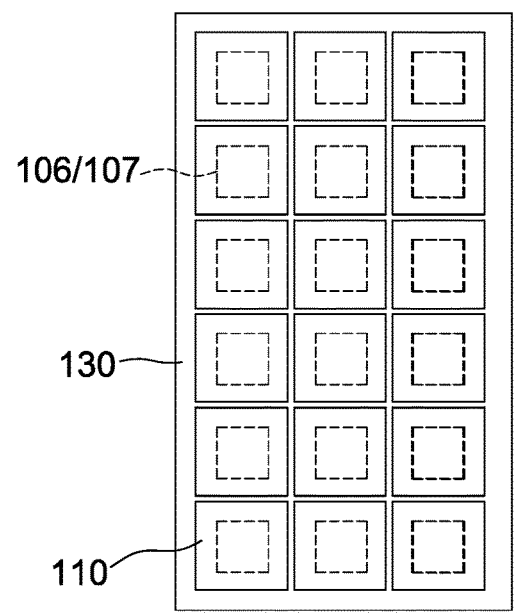
FIG. 6 illustrates a top view of semiconductor device packages according to some embodiments of the present disclosure.

FIG. 6 is a top view of semiconductor device packages according to some embodiments of the present disclosure. A lower substrate strip 130 is provided. An unit upper substrate 110 is provided. The upper substrate 110 is mounted to the lower substrate strip 130. Upon the mounting operation, a singulation operation is performed to divide the packages into individual packages.

The adhesive layer 106 and the spacer 107 are disposed underneath the upper substrate 110. In some embodiments, the spacer 107 may be directly disposed on the adhesive layer 106. In some embodiments, the spacer 107 is omitted and the adhesive layer 106 is directly disposed underneath the upper substrate 110. In some embodiments, the adhesive layer 106 may include a thermosetting resin. The adhesive layer 106 may include a thermoplastic resin. In some embodiments, the spacer 107 may include an epoxy resin or other suitable insulating materials.

The spacer 107 is pressed into the adhesive layer 106. The spacer 107 uniformly distributes the stress and forces resulting from at least some of the operations involved in manufacturing a semiconductor device package. The spacer 107 bonds well with the adhesive layer 106, and tilting issues and warpage issues can be avoided.

Figure 7:
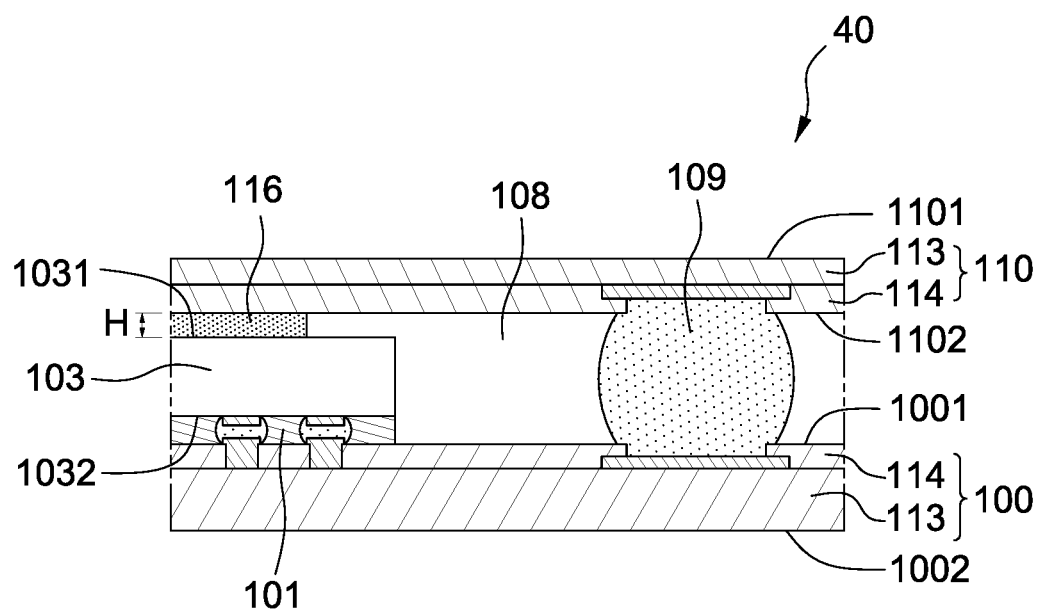
FIG. 7 illustrates a cross-sectional view of a comparative semiconductor device package.

FIG. 7 is a cross-sectional view of a comparative semiconductor device package 40. The structure depicted in FIG. 7 is similar to the structure depicted in FIG. 3, except that the adhesive layer 106 depicted in FIG. 3 is replaced with a thermoplastic layer 116. The arrangement of the thermoplastic layer 116 between the upper substrate 110 and the electrical component 103 can help to maintain a separation between components of the semiconductor package device 40 (e.g. between the lower surface 1102 of the upper substrate 110 and the upper surface 1031 of the electrical component 103), which can provide for a product that closely matches design specifications.

The thermoplastic layer 116 is an elastic film which is transformed from a soft film-type material into a gel-type material into an elastic film-type material through two or more curing operations. Since the thermoplastic layer 116 is an elastic material and is not a hard material, it may deform during curing operations or may deform during a mounting operation and/or a gang bonding operation. Thus it may be challenging to manufacture the thickness, area, and uniformity of the thermoplastic layer 116 as desired.

Figure 8:
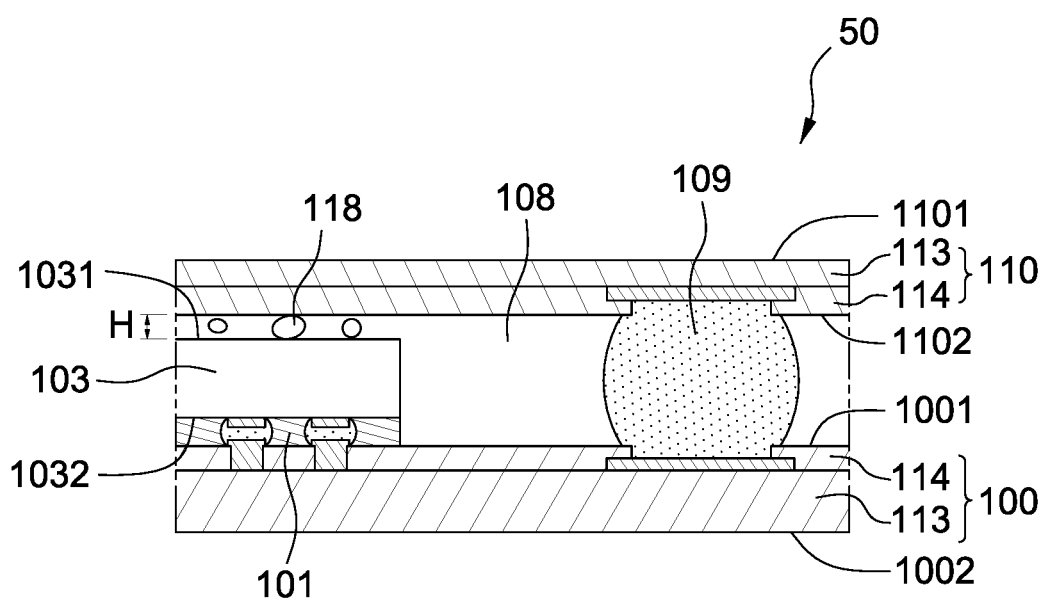
FIG. 8 illustrates a cross-sectional view of a comparative semiconductor device package.

FIG. 8 is a cross-sectional view of a comparative semiconductor device package 50. The structure depicted in FIG. 7 is similar to the structure depicted in FIG. 3, except that the height (H) is smaller than the average filler size of the fillers of the encapsulation layer 108. The encapsulation layer 108 is formed by an encapsulation operation. The encapsulation layer 108 partially, but not completely, fills the space between the top surface 1031 of the electrical component 103 and the bottom surface 1102 of the upper substrate 110 since the space/height ratio is not high enough to accommodate the formation of the encapsulation layer 108. Even though the encapsulation layer 108 may almost fill the space between the top surface 1031 of the electrical component 103 and the bottom surface 1102 of the upper substrate 110, voids 118 may still be generated in the encapsulation layer 108, especially in a portion of the encapsulation layer 108 disposed above the electrical component 103.

Figure 9:
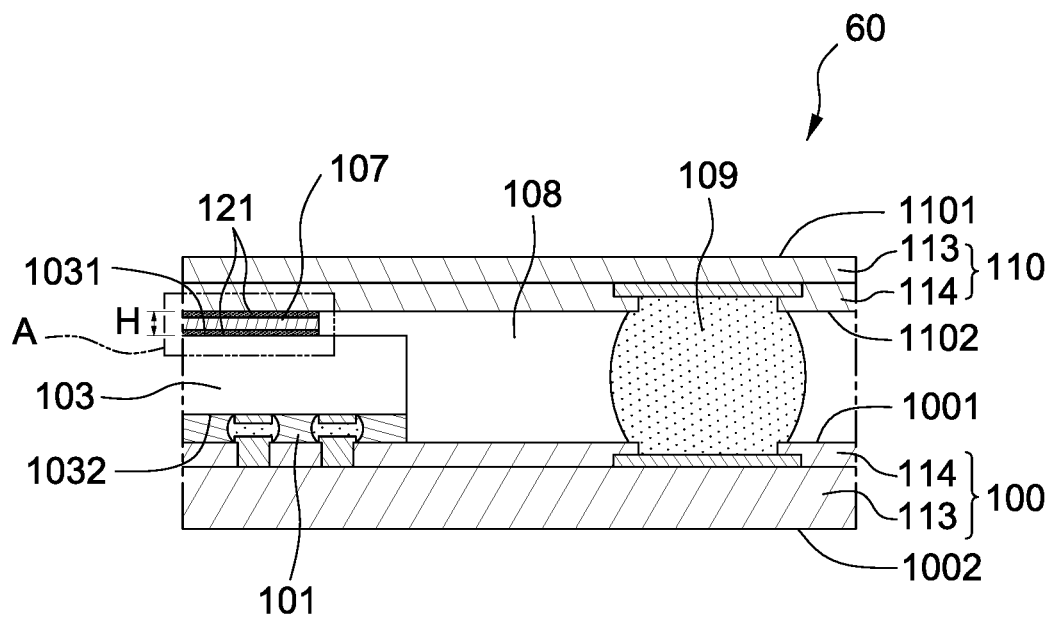
FIG. 9 illustrates a cross-sectional view of a comparative semiconductor device package.

FIG. 9 is a cross-sectional view of a comparative semiconductor device package 60. The structure depicted in FIG. 9 is similar to the structure depicted in FIG. 3, except for the arrangement of the spacer 107 and the adhesive layer 106 depicted in FIG. 3 is replaced with an arrangement of two adhesive layers 121 (an upper adhesive layer 121 and a lower adhesive layer 121) and a spacer 107. The upper adhesive layer 121 directly contacts the bottom surface 1102 of the upper substrate 110 and the top surface of the spacer 107. The lower adhesive layer 121 directly contacts the bottom surface of the spacer 107 and the top surface 1031 of the electrical component 103. In some embodiments, the upper adhesive layer 121 may include a thermosetting resin or a thermoplastic resin. The lower adhesive layer 121 may include a thermosetting resin or a thermoplastic resin. In some embodiments, materials of the upper adhesive layer 121 and the lower adhesive layer 121 may be substantially the same. In some embodiments, the materials of the upper adhesive layer 121 and the lower adhesive layer 121 may be different from each other.

Figure 10:
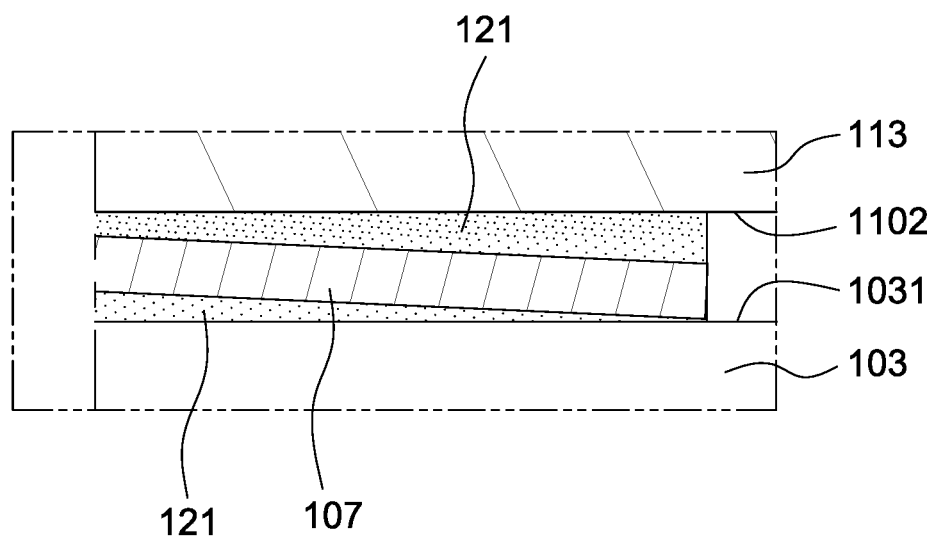
FIG. 10 illustrates a cross-sectional view of an arrangement between an upper substrate and an electrical component of a comparative semiconductor device package.

FIG. 10 illustrates a cross-sectional view of the arrangement of two upper adhesive layers 121 and the spacer 107 disposed between the upper substrate 110 and the electrical component 103 of the semiconductor device package 60 as shown in FIG. 9. Since the upper adhesive layer 121 and the lower adhesive layer 121 themselves may be non-uniformly distributed, the spacer 107 disposed between the upper adhesive layer 121 and the lower adhesive layer 121 may not distribute stress well and may tilt during the mounting operation and the gang bonding operation. If one or both of the upper adhesive layer 121 and the lower adhesive layer 121 includes a thermoplastic resin, tilting issues may be more pronounced due to thermal characteristics of the thermoplastic resin itself (e.g. characteristics that affect a behavior of the thermoplastic resin during curing operations).

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 within 30 within 20 within 10 or within 1 μm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A semiconductor device package, comprising:
   a first substrate;
   an electrical component disposed on the first substrate;
   a second substrate disposed over the electrical component;
   an adhesive layer disposed between the electrical component and the second substrate;
   a spacer directly contacting both the adhesive layer and the second substrate; and
   an encapsulation layer disposed between the first substrate and the second substrate.

2. The semiconductor device package of claim 1, further comprising an interconnection element electrically connecting a top surface of the first substrate and a bottom surface of the second substrate.

3. The semiconductor device package of claim 2, wherein the interconnection element includes tin and a diameter of the interconnection element is in a range from approximately 0.10 millimeters (mm) to approximately 0.16 mm.

4. The semiconductor device package of claim 2, wherein the encapsulation layer encapsulates the electrical component, the adhesive layer, the spacer, and the interconnection element.

5. The semiconductor device package of claim 2, wherein the interconnection element comprises a conductive post, a solder ball, or a coated metal ball.

6. The semiconductor device package of claim 1, wherein a top surface of the electrical component is separated from a bottom surface of the second substrate by a height (H).

7. The semiconductor device package of claim 6, wherein the encapsulation layer includes fillers, and wherein the height (H) is greater than or equal to about three times an average diameter of the fillers.

8. The semiconductor device package of claim 1, wherein the adhesive layer and the spacer partially cover the electrical component.

9. The semiconductor device package of claim 1, wherein the adhesive layer and the spacer cover substantially an entire top surface of the electrical component.

10. The semiconductor device package of claim 1, wherein the adhesive layer comprises a thermosetting resin.

11. The semiconductor device package of claim 1, wherein the spacer comprises an epoxy resin.

12. The semiconductor device package of claim 1, wherein the spacer has a thickness in a range from approximately 5 micrometers (μm) to approximately 25 μm.

13. The semiconductor device package of claim 1, wherein the spacer comprises a same material as the encapsulation layer.

14. The semiconductor device package of claim 1, wherein the electrical component is a first electrical component, and the semiconductor device package further comprises a second electrical component disposed on the second substrate.

15. A semiconductor device package, comprising:
    a first substrate;
    an electrical component disposed on the first substrate;
    a second substrate disposed over the electrical component;
    an adhesive layer disposed between the electrical component and the second substrate and in direct contact with both the electrical component and the second substrate; and
    an encapsulation layer disposed between the first substrate and the second substrate.

16. The semiconductor device package of claim 15, further comprising an interconnection element electrically connecting a top surface of the first substrate and a bottom surface of the second substrate.

17. The semiconductor device package of claim 16, wherein the adhesive layer comprises a thermosetting resin.

18. The semiconductor device package of claim 15, wherein a top surface of the electrical component is separated from a bottom surface of the second substrate by a height (H).

19. The semiconductor device package of claim 18, wherein the encapsulation layer includes fillers, and wherein the height (H) is greater than or equal to about three times an average diameter of the fillers.

20. The semiconductor device package of claim 15, wherein the adhesive layer has a thickness in a range from approximately 10 μm to approximately 30 μm.

* * * * *